(12) United States Patent
Back et al.

(10) Patent No.: US 7,364,461 B1
(45) Date of Patent: Apr. 29, 2008

(54) DIRECT ATTACHMENT OF COAXIAL CABLES

(75) Inventors: Gerald W. Back, Gilbert, AZ (US); Roger A. Sneddon, Gilbertsville, PA (US)

(73) Assignee: SV Probe Pte. Ltd., Singapore (SG)

( * ) Notice: Subject to any disclaimer, the term of this patent is extended or adjusted under 35 U.S.C. 154(b) by 0 days.

(21) Appl. No.: 11/712,796

(22) Filed: Feb. 28, 2007

(51) Int. Cl.
*H01R 9/05* (2006.01)
(52) U.S. Cl. ........................ 439/581; 439/329
(58) Field of Classification Search ............... 439/329, 439/497, 578–585
See application file for complete search history.

(56) References Cited

U.S. PATENT DOCUMENTS

| | | | | |
|---|---|---|---|---|
| 5,195,910 A | * | 3/1993 | Enomoto et al. | 439/578 |
| 5,842,873 A | * | 12/1998 | Gonzales | 439/63 |
| 6,626,680 B2 | * | 9/2003 | Ciurzynski et al. | 439/874 |
| 6,817,899 B1 | * | 11/2004 | Zerebilov | 439/582 |
| 6,837,741 B2 | * | 1/2005 | Kuwahara | 439/497 |
| 2003/0117129 A1 | * | 6/2003 | Parrish | 324/158.1 |

* cited by examiner

*Primary Examiner*—James Harvey
(74) *Attorney, Agent, or Firm*—Hickman Palermo Truong & Becker LLP

(57) ABSTRACT

Techniques for attaching a coaxial cable to an assembly are provided. A conductive layer is applied to a top and bottom surface of a first layer and the bottom surface of a second layer. An aperture is formed through the first layer. The first layer is affixed to the top of the second layer to form an assembly. A signal via and one or more shield vias are formed in the assembly. The signal via and the one or more shield vias, are covered with a conductive layer. The signal via is then electrically separated from the shield vias and the aperture. A stripped coaxial cable may then be inserted into the aperture so that the conductive core of the coaxial cable is electrically connected to the signal via but electrically isolated from the shield vias and aperture. The coaxial cable may then be secured to the assembly.

6 Claims, 8 Drawing Sheets

First layer of assembly

Second layer of assembly

DIRECT ATTACHMENT OF COAXIAL CABLES

FIELD OF THE INVENTION

The present invention relates to connecting a coaxial cable to a structure, including, but not limited to, an assembly, a printed circuit board (PCB), or a substrate.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

A probe card or probe card assembly (PCA) may be used in semiconductor wafer testing. In order to provide electrical connections between a device under test (DUT) and a tester, an interposer (such as a tester computer card or the like) may be used to provide an interface between the tester and a probe card. The probe card, in turn, connects to the DUT through an interconnect. The interconnect may be comprised of a series of pogo or spring pins, probes, or other forms. The probe card may be comprised of a printed circuit board (PCB) or a substrate, such as a multi-layer organic (MLO) or a multi-layer ceramic (MLC).

When coaxial cables are employed as part of the interposer between the tester and the probe card, the electrical connection between the coaxial cable(s) and the interposer is made at the surface of the interposer with the coaxial cable laid on its side relative to the surface of the interposer to which the coaxial cable is connected. Metal connectors may be used to connect each coaxial cable to the structure, e.g., by forming SMA or SMB assemblies. This approach for connecting coaxial cables to a structure requires a relatively large amount of surface area on the surface of the structure to which a coaxial cable is to be connected. As a result, such an approach for connecting coaxial cables to a structure limits the density of coaxial cable connections that may be made to such a structure. Further, such an approach for connecting coaxial cables to a structure may be time consuming and relatively expensive.

DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of the embodiments of the invention presented herein. It will be apparent, however, that the embodiments of the invention presented herein may be practiced without these specific details. In other instances, well-known structures and devices are shown in block diagram form in order to avoid unnecessarily obscuring the embodiments of the invention presented herein.

Functional Overview

Embodiments of the invention may be used to attach a coaxial cable to an assembly in a manner that establishes an electrical connection between the coaxial cable and the assembly. Embodiments of the invention may be used to attach a coaxial cable to a wide variety of structures, including but no limited to, a printed circuit board (PCB), a multi-layer organic (MLO), a multi-layer ceramic (MLC), or any type or example of a substrate or assembly. For example, embodiments of the invention may be applicable in any coaxial cable assembly that connects with an interface.

Embodiments of the invention employ an approach that allows more coaxial cable connections per unit area of the structure to which the coaxial cables are attached. As a result, embodiments of the invention allow a greater density of coaxial cable connections to be made as compared to prior approaches.

In an embodiment, a conductive layer is applied to a top and bottom surface of a first layer and the bottom surface of a second layer. An aperture is formed through the first layer. The first layer is affixed to the top of the second layer to form an assembly. A signal via and one or more shield vias are then formed in the assembly. The signal via and the one or more shield vias, are covered with a conductive layer. The signal via is then electrically separated from the shield vias and the aperture. A stripped coaxial cable may then be inserted into the aperture so that the conductive core of the coaxial cable is electrically connected to the signal via but electrically isolated from the shield vias and aperture. The coaxial cable may then be secured to the assembly As used herein, the terms "coax cable" and "coaxial cable" shall be used to refer to a cable, or the like, having a central electrically conductive cable (a "center cable") electrically isolated from at least one peripheral conductor having a common longitudinal axis with the central electrically conductive cable. To illustrate, a coaxial cable may comprise a conductive core that is surrounded by an insulating spacer sheath. The insulating spacer sheath may, in turn, be surrounded by a conductive sheath. The conducting sheath may, in turn, be surrounded by a protective, insulating exterior.

Direct Attachment of Coaxial Cables

FIGS. 1A-6 depict a sequence of side sectional views of assemblies that illustrates how embodiments of the invention may be used to attach a coaxial cable to an assembly.

Figure 1A:
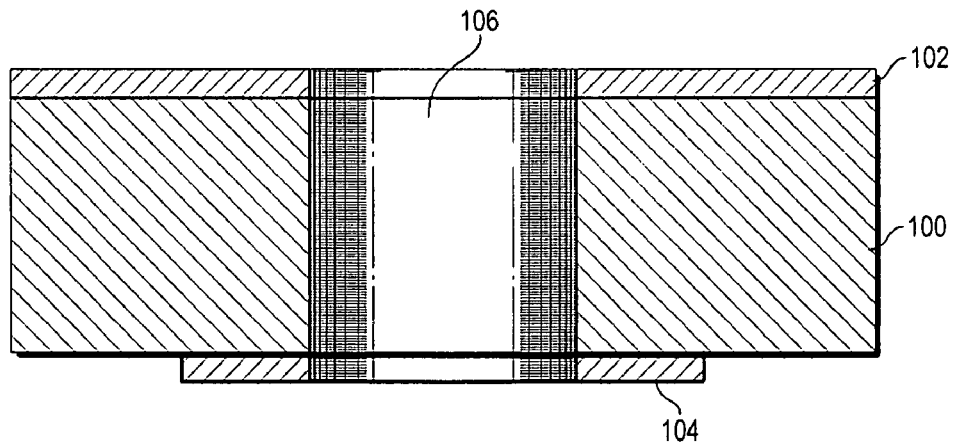
FIG. 1A through FIG. 6 are a sequence of side sectional views of assemblies that illustrates how embodiments of the invention may be used to attach a coaxial cable to an assembly.

As illustrated in FIG. 1A, upper conductive layer (also referred to below as "top conductive layer") 102 and lower, central conductive layer (also referred to below as "middle conductive layer") 104 may be disposed on (for example, by, without limitation, plating, sputtering, or any other known approach or later developed approach) the respective upper and lower surfaces of layer 100. Layer 100 may form part of an assembly, such as a printed circuit board (PCB), a multi-layer organic (MLO), a multi-layer ceramic (MLC), or any type or example of a substrate or assembly.

Aperture 106 may then be formed (for example, without limitation, by drilling, boring, etching, photolithography) through upper conductive layer 102, layer 100, and lower conductive layer 104 in a location that is essentially central to lower conductive layer 104. The purpose of aperture 106 is to accommodate the placement of a portion of coaxial cable within aperture 106. The portion of the coaxial cable which will be positioned within aperture 106 will have the protective, insulating exterior removed to expose the conductive sheath. As such, the diameter of aperture 106 should be wide enough so that the portion of the coaxial cable with the protective, insulating exterior removed may be positioned therein. While only a single aperture 106 is illustrated in the embodiment shown in FIG. 1A, other embodiments of the invention not depicted may form two or more apertures 106 in layer 100.

Figure 1B:
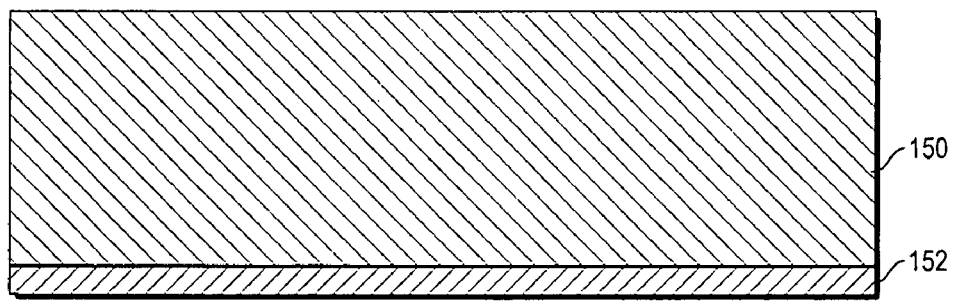

As illustrated in FIG. 1B, lower conductive layer (also referred to below as bottom conductive layer) 152 may be disposed on (for example, by, without limitation, plating, sputtering, or any other known approach or later developed approach) the lower surface of layer 150. Layer 150 may form another layer of the assembly of which layer 100 also forms.

Figure 2:
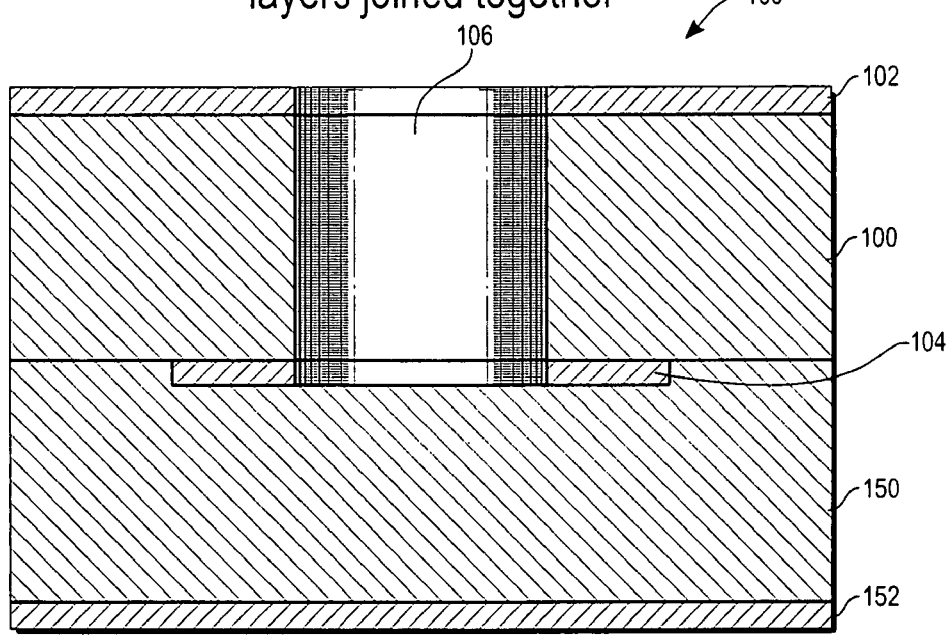

As illustrated in FIG. 2, layer 100 and layer 150 may be joined to form assembly 160 so that lower, central conductive layer 104 becomes middle, central conductive layer 104. As shown in the embodiment of FIG. 2, layer 100 is an upper layer of assembly 160, while layer 150 is lower layer in assembly 160. Layers 100 and 150 may be joined together by any approach currently known or later developed for joining two structures or layers, such as by laminating layers 100 and 150 to form assembly 160. In an embodiment (such as the embodiment depicted in FIG. 7), assembly 160 may comprise multiple subassemblies (such as subassemblies 700 depicted in FIG. 7).

Each of layers 100 and 150 may comprise, for example, a dielectric material, such as polyimide, FR4, or fiberglass. Top, middle and bottom conductive layers 102, 104, and 152 may each be comprised of copper or any other conductive material.

Figure 3:
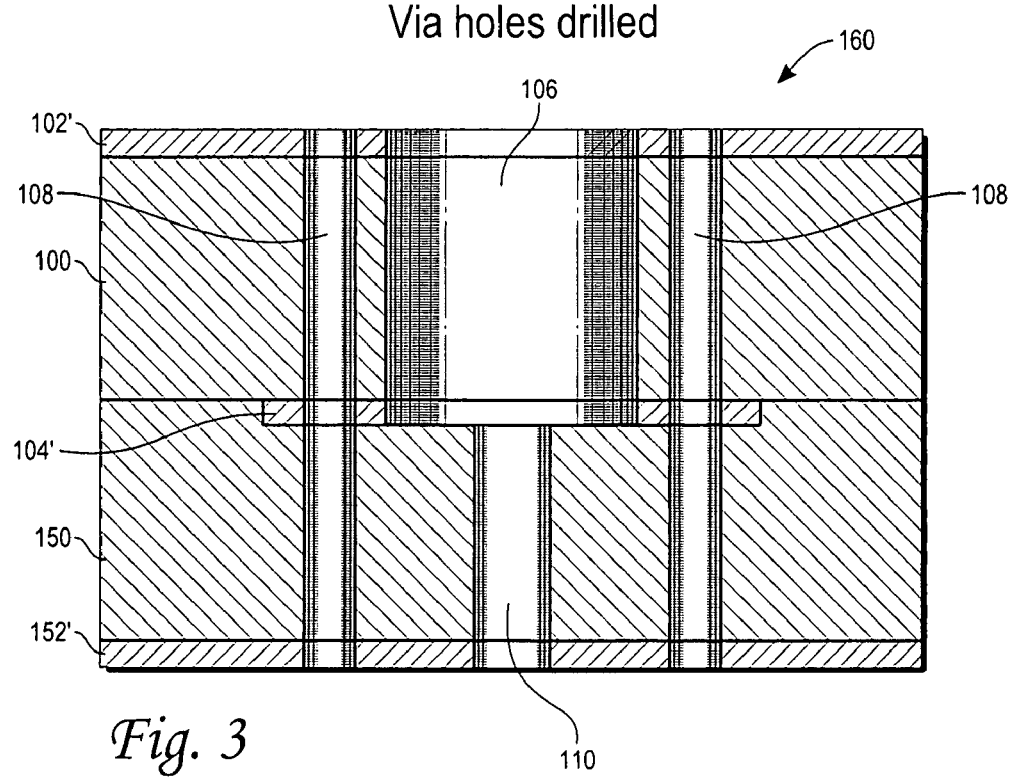

As illustrated in FIG. 3, one or more shield vias 108 and a signal via 110 may then be formed (for example, without limitation, by drilling, boring, etching, or photolithography) in assembly 160. After the formation of one or more shield vias 108 and signal via 110, top, middle and bottom conductive layers 102, 104, and 152 shall be referred to herein as first-patterned top layer 102', first-patterned middle layer 104', and first-patterned bottom conductive layer 152' respectively.

The purpose of forming signal via 110 in assembly 160 is that signal via 110 signal via 110 shall receive a coaxial cable that has had the insulating exterior, conductive sheath and the insulating spacer sheath removed from a coaxial cable to expose the conductive core of the coaxial cable. In an embodiment, signal via 110 may be formed through lower structure layer 150. In the embodiment shown in FIG. 3, signal via 110 may be centered on, and in communication with, aperture 106. As a result, after formation of signal via 110, a passage may be created from first-patterned bottom conductive layer 152' to first-patterned top conductive layer 102', and which extends through layer 150, conductive layer 104', and layer 100.

Figure 7:
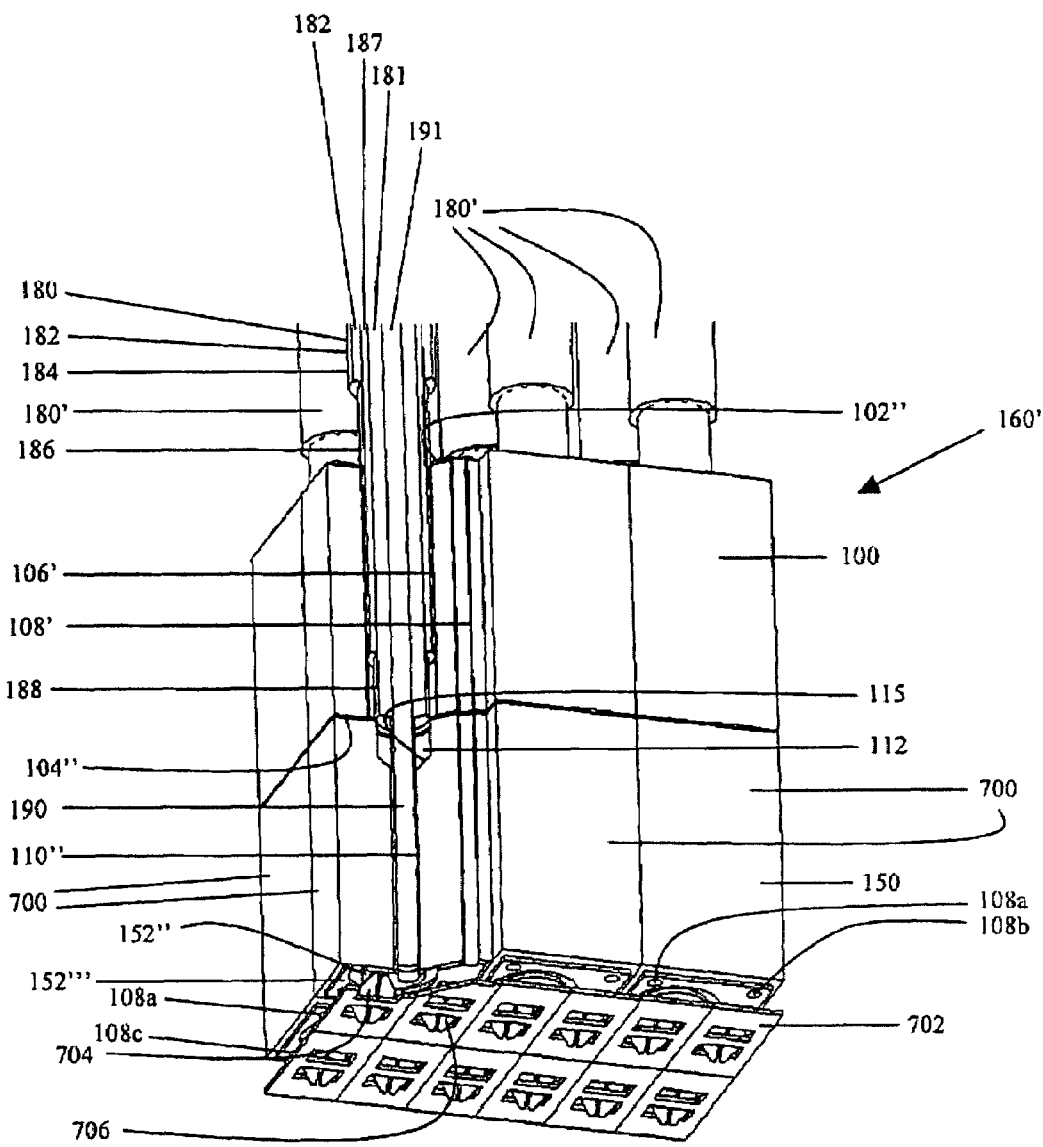
FIG. 7 is a perspective partial cut away view of an attachment of coaxial cables to a printed circuit board (PCB) according to an embodiment of the invention.

The purpose of the one or more shield via(s) 108 is to shield the signal carried by the conductive core of the coaxial cable positioned within signal via 110. Any number and arrangement of shield vias 108 may be used by embodiments of the invention. For example, four (4) shield vias 108 may be formed ninety degrees (90°) apart from each other (relative to signal via 110) and in a square pattern (such an arrangement is shown in FIG. 7) through upper and lower structure layers 100 and 150 and equidistant from signal via 110. In other embodiments which have more or less than four (4) shield vias 108, each of the shield vias 108 may also be arranged more or less equidistant from signal via 110 and spaced approximately evenly between each other. Note that one or more shield vias 108 are optional; thus, embodiments of the invention may not include one or more shield vias 108.

In an embodiment, each shield via 108 may have a diameter of, for example, from about 8 to 15 mils, and according to a particular embodiment of the present invention from about 10 to 12 mils. In an embodiment, signal via 110 has a diameter of from about 4 to 6 mils larger than the diameter of the conductor core of the coaxial cable to be positioned in signal via 110.

Figure 4:
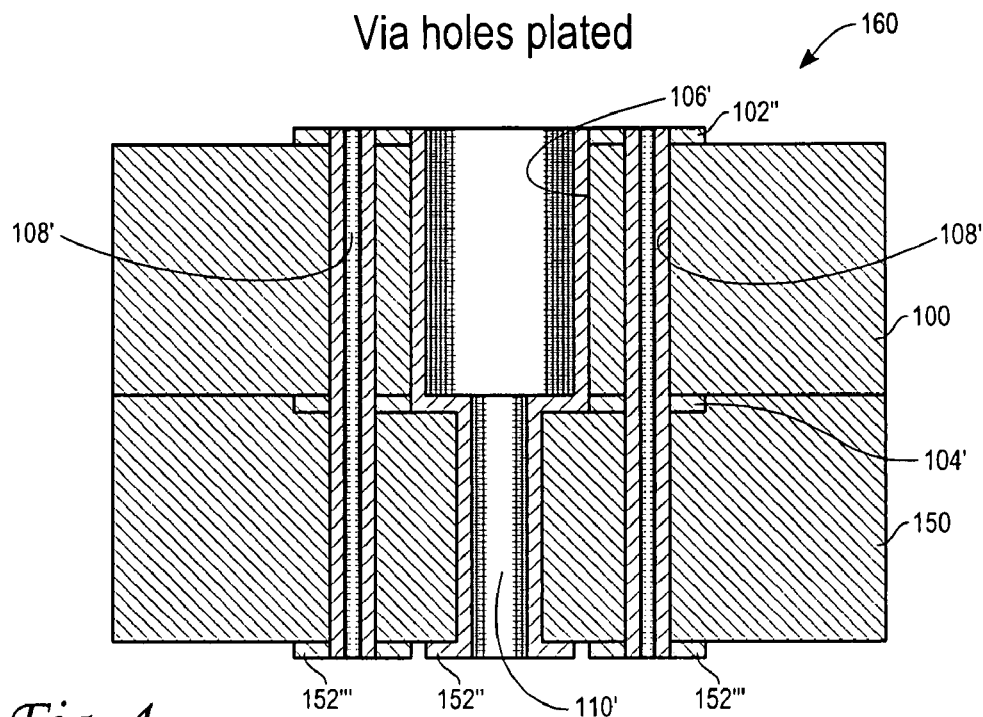

As illustrated in FIG. 4, assembly 160 may be subjected to a plating process to plate the interior of aperture 106, the interior of shield vias 108, and the interior of signal via 110 to form plated aperture 106', plated shield vias 108' and plated signal via 110'. It is noted that this plating process may also add to the thickness of upper conductive layer 102' and lower conductive layer 152'. The plating may comprise, for example, copper, nickel, and/or gold. The plating may be of any thickness that accommodates the positing of a coaxial cable within the interior of aperture 106. In an embodiment, the plating may have a thickness of, for example, from about 1 to 4 mils.

First patterned top and bottom conductive layers 102' and 152' may then be patterned (for example, without limitation, by etching, lithography, and other standard PCB manufacturing techniques) to form: (1) second patterned top conductive layer 102'' centered about plated aperture 106' and encompassing respective plated shield vias 108', and (2) (a) bottom conductive signal portion 152'' centered about plated signal via 110'; and (b) bottom conductive shield portion(s) 152''' centered about plated shield vias 108'. The bottom conductive shield portion(s) 152''' may form a unitary structure (for example, as shown in FIG. 7 and discussed in further detail below). Bottom conductive signal portion 152'' may be electrically isolated from bottom conductive shield portion 152'''

Figure 5:
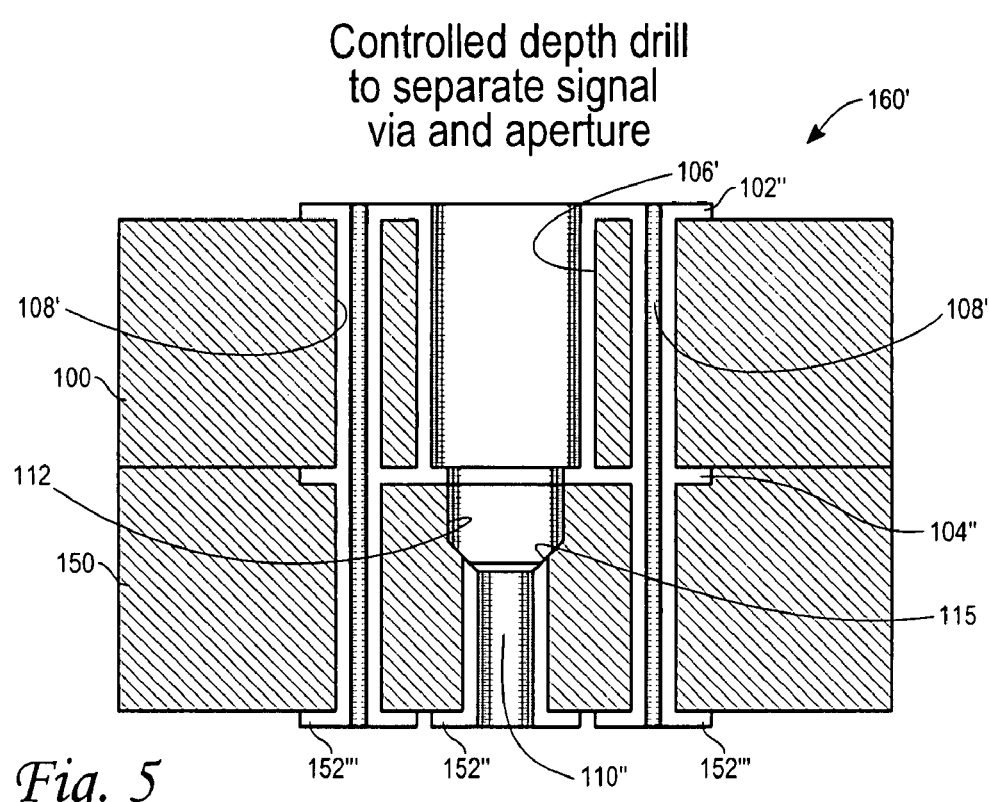

As illustrated in FIG. 5, a controlled depth drill (or similar operation), approximately centered about the plated aperture 106', may be performed through first-patterned middle conductive layer 104' (to form second-patterned middle conductive layer 104'') and into layer 150 to form isolating aperture 112 approximately centered about plated core aperture 106' (to form assembly 160'). Assembly 160' may comprise multiple subassemblies 700 (as shown in FIG. 7). Isolating aperture 112 may define shoulder 115 and may electrically isolate the remaining plated signal via 110'' from plated shield via 106' and plated shield vias 108'.

In an embodiment, isolating aperture 112 has a diameter from about 2 to 4 mils smaller then the insulating spacer shield of the coaxial cable to be positioned within isolating aperture 112 to about 10-15 mils larger than signal via 110. In an embodiment, isolating aperture 112 has a depth from the lower surface of second-patterned middle conductive layer 104'' to about 50 to 100 mils into layer 150.

Figure 6:
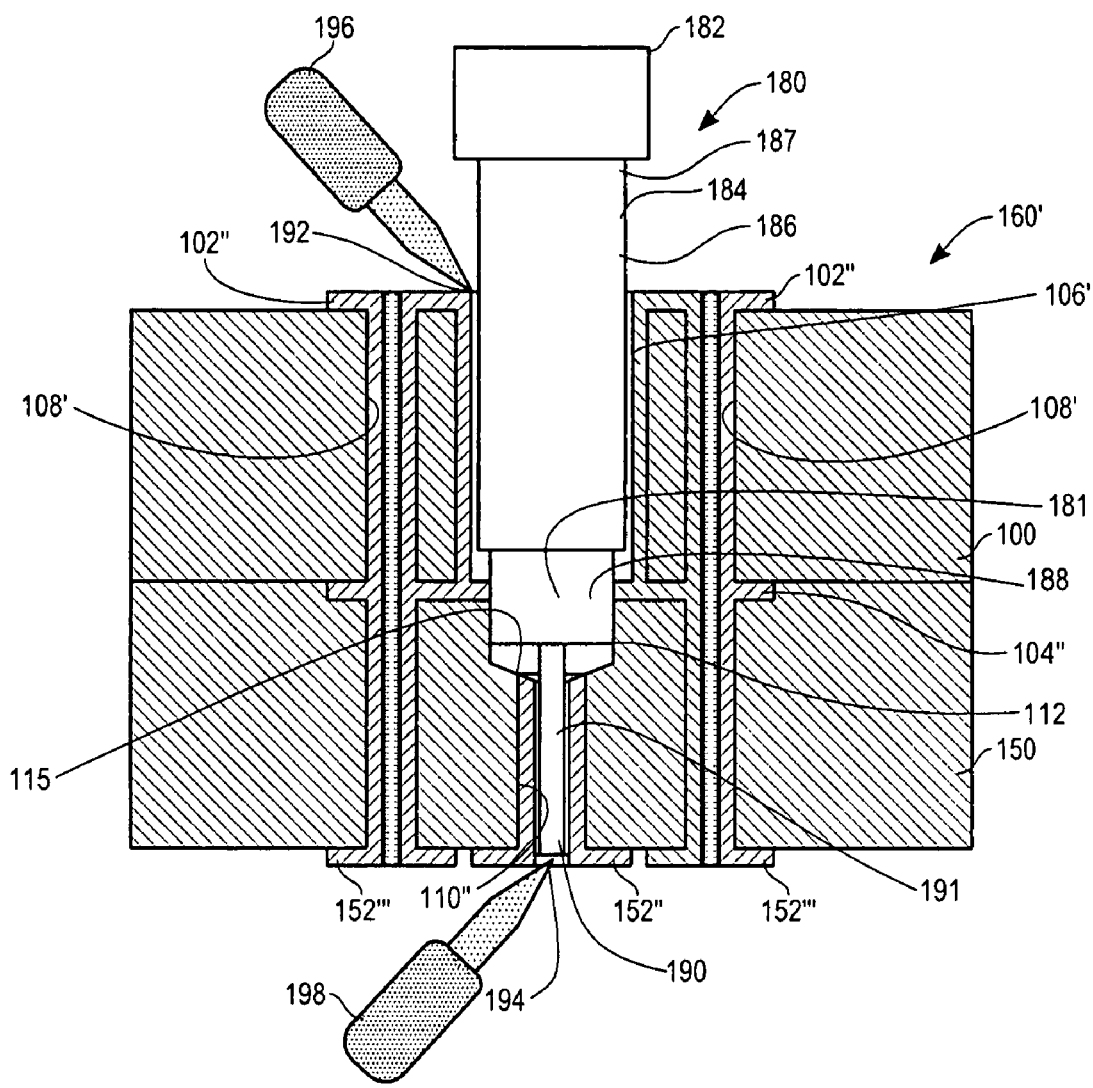

As illustrated in FIG. 6, coaxial cable 180 may be inserted into assembly 160' of FIG. 5. In an embodiment, the following steps may be performed to coaxial cable 180 prior to insertion into assembly 160': (1) a portion of insulating exterior 182 of coaxial cable 180 may be removed or stripped from one end 184 of coaxial cable 180 to expose portion 186 of conductive sheath 187; (2) a further portion of exposed conductive sheath 187 may be in turn removed to expose portion 188 of insulating spacer sheath 181; and (3) a further portion of exposed insulating spacer sheath 181 may be in turn removed to expose portion 190 of the conductive core 191 of coaxial cable 180.

Stripped end 184 of coaxial cable 180 may then be inserted into assembly 160'. Inserting stripped end 184 into assembly 160' causes several things to occur. Upon inserting stripped end 184 into assembly 160', at least a portion of exposed conductive sheath 187 may be received by plated core aperture 106' such that the remaining plated signal via 110" and bottom conductive signal portion 152" may be electrically isolated from plated shield vias 108', bottom conductive shield portion(s) 152''', and plated core aperture 106'.

Also, upon inserting stripped end 184 into assembly 160', at least a portion of exposed insulating spacer sheath 181 may or may not be received by isolating aperture 112. In other words, a bottom portion of insulating spacer sheath 181 may simply abut the upper surface of isolating aperture shoulder 115 or may even not abut the upper surface of isolating aperture shoulder 115.

Additionally, upon inserting stripped end 184 into assembly 160', at least a portion 190 of the exposed conductive core 191 may be received by at least a portion of remaining plated signal via 110".

It is noted that only air may separate conductive core 190 and conductive sheath 186 as isolating aperture 112 electrically isolates remaining plated signal via 110" and bottom conductive signal portion 152" from plated shield vias 108', bottom conductive shield portion(s) 152''', and plated core aperture 106'. In an embodiment, solder or another type of conductive coupling may be used to ensure a stable and long lasting connection between coaxial cable 180 and assembly 160'.

After stripped end 184 of coaxial cable 180 has been inserted into assembly 160', coaxial cable 180 may be affixed in place using solder (or other conductive coupling mechanisms such as, without limitation, crimping, electroconductive paste or electroconductive glue, etc.) at locations 192 and 194 using, for example, respective soldering irons 196 and 198, or the like, such that at least a portion of exposed conductive core portion 190 of coaxial cable 180 may be received by at least a portion of remaining plated signal via 110". While a single coaxial cable 180 has been illustrated being affixed to assembly 160', in other embodiments of the invention (for example, see FIG. 7) multiple coaxial cables 180, 180' may be so attached to assembly 160'.

Figure 10:
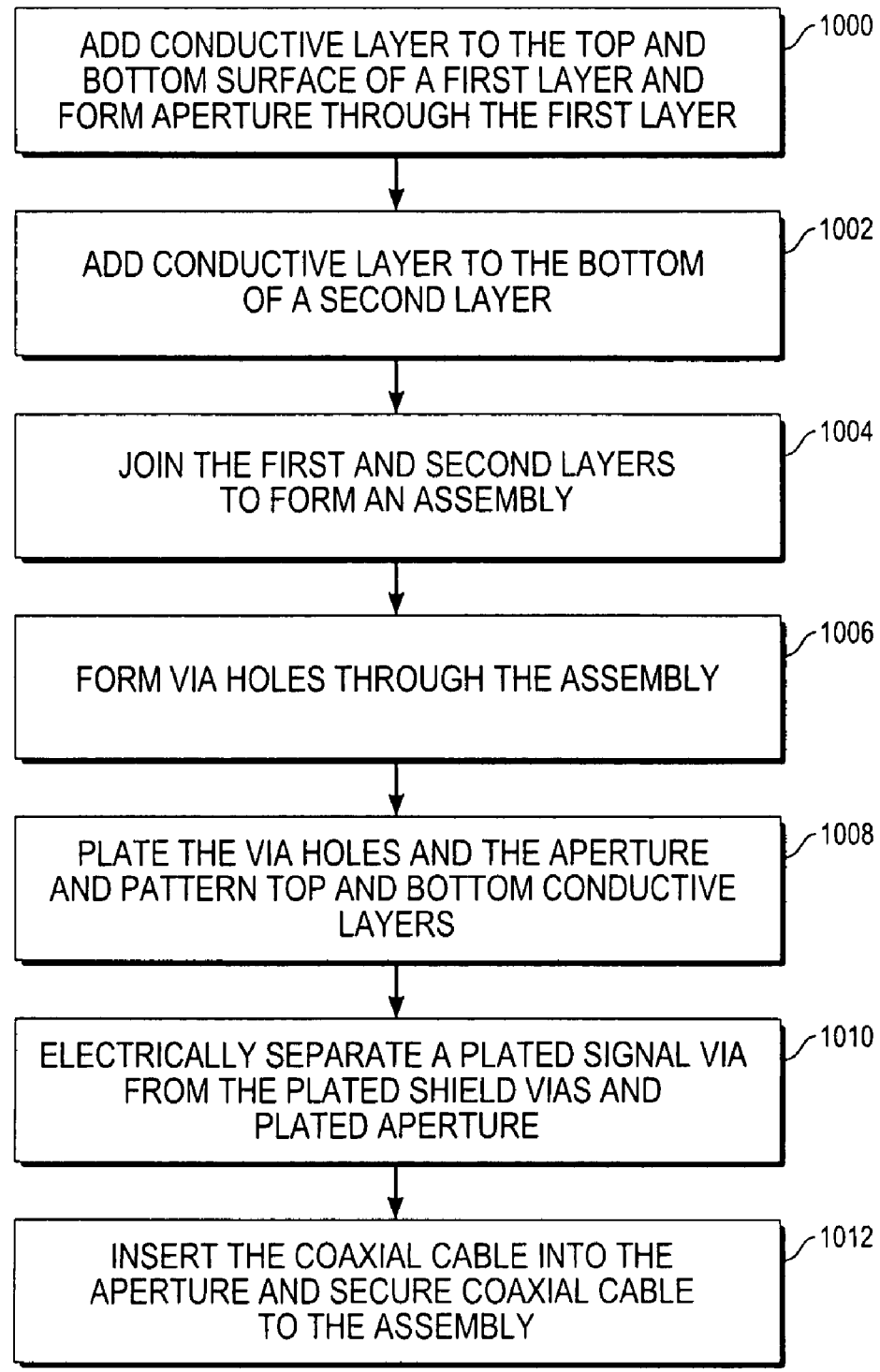
FIG. 10 is a flowchart for attaching coaxial cables according to an embodiment of the invention.

FIG. 10 is a flowchart for attaching coaxial cables according to an embodiment of the invention. As illustrated by step 1000, the top and bottom surfaces of a first layer may be patterned to form respective top and bottom conductive layers. An initial aperture ("the core aperture") may then be formed through the patterned first layer.

In step 1002, a conductive layer may be disposed on the bottom surface of a second layer.

In step 1004, the first and second layers may then be joined together to form an assembly having a top, middle and bottom conductive layers. For example, the first and second layers may be joined by laminating to form a laminated structure having a top, middle and bottom conductive layers.

In step 1006, via holes may then be formed (via holes may be formed by drilling, boring, etching, photolithography, etc.) through the assembly to form (a) a signal via continuing from the approximate center of the core aperture, and (b) a plurality of shield vias spaced apart from the core aperture and signal via. For example, four shield vias may be spaced about 90° apart from each other (relative to core aperture and signal via and in a square pattern, as shown in FIG. 7.

In step 1008, the signal via, the shield vias, and the core aperture may then be plated throughout. This plating may also add plating to the exposed top and bottom conductive layers of the assembly. The plated top and bottom conductive layers may then be patterned to form: (1) a second patterned top conductive layer centered about the plated core aperture and encompassing the respective plated shield vias; and a respective: (2) (a) bottom conductive signal portion substantially centered about the plated signal via; and (b) bottom conductive shield portion(s) substantially centered about the plated shield vias. The bottom conductive shield portion(s) may form a unitary structure (such as shown in FIG. 7). The bottom conductive signal portion may be electrically isolated from the bottom conductive shield portion.

In step 1010, a controlled depth drilling (or similar operation), substantially centered about the plated core aperture, may then be performed through the first-patterned middle conductive layer and into the second, lower layer to form an isolating aperture. This may electrically isolate the plated core aperture, and hence the plated shield vias and respective bottom conductive shield portion(s), from the remaining plated signal via and bottom conductive shield portion.

In step 1012, a partially stripped coaxial cable may then be inserted into, and connected with, the assembly to internally electrically connect the coaxial cable to the assembly. In an embodiment, a portion of the protective, insulating exterior of a coaxial cable may be removed (e.g., by stripping) from one end of the coaxial cable to expose a portion of the conductive sheath. A portion of the conductive sheath may, in turn, be removed to expose a portion of the insulting space sheath. A portion of the exposed insulting space sheath may, in turn, be removed to expose a portion of the conductive core.

The stripped end of the coaxial cable may then be inserted into the assembly (at the core aperture). After the stripped end of the coaxial cable is inserted into the assembly at the core aperture, solder (or another conductive coupling such as, for example, without limitation, crimping, electroconductive paste or electroconductive glue.) may be applied using, for example, soldering irons such that: (1) at least a portion of the exposed signal conductor portion may be received by at least a portion of the remaining plated signal via, and (2) at least a portion of the exposed coax dielectric portion may be received by the isolating aperture, and (3) at least a portion of the exposed shield conductor portion may be received by the plated core aperture such that the remaining plated signal via and bottom conductive signal portion may be electrically isolated from the plated signal vias, bottom conductive shield portion(s), and plated core aperture. Solder, or another type of conductive coupling, may be used to ensure a stable and long lasting connection between the coaxial cable and the assembly.

As illustrated in FIG. 7, in a perspective partial cut away view, there is shown an illustrative assembly 160' having multiple coaxial cables 180, 180' physically connected and electrically connected internally thereto in accordance with an exemplary embodiment of the present invention.

Upper structure layer 100 may be joined, for example and without limitation, by lamination, to second, lower layer 150 (with second-patterned middle conductive layer 104" there between) forming assembly 160'.

One end 184 of exemplary coaxial cable 180 is illustrated as being internally physically and internally electrically connected to assembly 160'. A portion of jacket 182 of coaxial cable 180 may be removed (e.g., by stripping or similar means) from end 184 of coaxial cable 180 to expose portion 186 of shield conductor 187. A portion of exposed shield conductor portion 186 may in turn be removed to expose portion 188 of coax dielectric 181. A portion of exposed coax dielectric portion 188 may in turn be removed to expose portion 190 of central signal conductor 191.

At least a portion of exposed signal conductor portion 190 may be received by, at least a portion of, a remaining plated signal via 110" to establish an electrical connection there between. At least a portion of the exposed coax dielectric portion 188 may or may not be received by isolating via 112, i.e., a bottom portion of exposed coax dielectric portion 188 may simply abut the upper surface of isolating aperture shoulder 115 or may even not abut the upper surface of isolating aperture shoulder 115. At least a portion of exposed shield conductor portion 186 may be received by plated core aperture 106' to establish an electrical connection there between such that the remaining plated signal via 110" and bottom conductive signal portion 152" may be electrically isolated from the plated shield vias 108', bottom conductive shield portion(s) 152''', and plated core aperture 106'.

Solder (not shown in FIG. 7) (or another conductive coupling such as, for example, without limitation, crimping, electroconductive paste and electroconductive glue), applied proximate to the upper and lower apertures 106' (core aperture), 110" (signal via) and proximate coaxial cable 180, may be used to ensure a stable and long lasting connection between coaxial cable 180 and assembly 160'.

The electrical path from exposed shield conductor portion 186 of coaxial cable 180 may extend: (1) from plated core aperture 106' to second patterned top conductive layer 102" on first, upper layer 100 through one or more of plated shield vias 108' to respective bottom conductive shield portion(s) 152''' (surrounding, but electrically isolated from bottom conductive shield portion 152"); and/or (2) from second patterned top conductive layer 102" on first, upper layer 100 through one or more of plated shield vias 108' to respective bottom conductive shield portion(s) 152'''. It is noted that the solder or conductive coupling applied proximate to plated core aperture 106' may facilitate either or both of these electrical pathways.

The electrical path from exposed central signal conductor 190 of coaxial cable 180 may be to and through remaining plated signal via 110" to bottom conductive signal portion 152". It is noted that the solder applied proximate to remaining plated signal via 110" at the bottom of assembly 160' may facilitate this electrical pathway.

As illustrated in FIG. 7, four shield vias 108a, 108b, 108c and 108d (not shown) may be formed ninety degrees (90°) apart from each other, relative to central remaining plated signal via 110" for each subassembly 700 of structure assembly 160'.

Respective bottom conductive signal portion(s) 152" and bottom conductive shield portions 152''' for each coaxial cable 180, 180' connection may electrically contact respective sets of signal contacts 704 and shield contacts 706 on interconnect 702 adapted for such contact.

While, as illustrated in FIG. 7, interconnect 702 may comprise a flexible sheet having respective protruding probe structures 704, 706, other interconnects 702 may be employed by other embodiments of the invention such as a spring-pin interconnect, a pogo pin interconnect, etc., or other interconnects adapted for such electrical contacts. For example, in probe card technology, interconnect 702 may be used to connect a tester (not shown) (electrically coupled to the other end of coaxial cables 180, 180') to a probe card (not shown) through structure assembly 160'.

Figure 8:
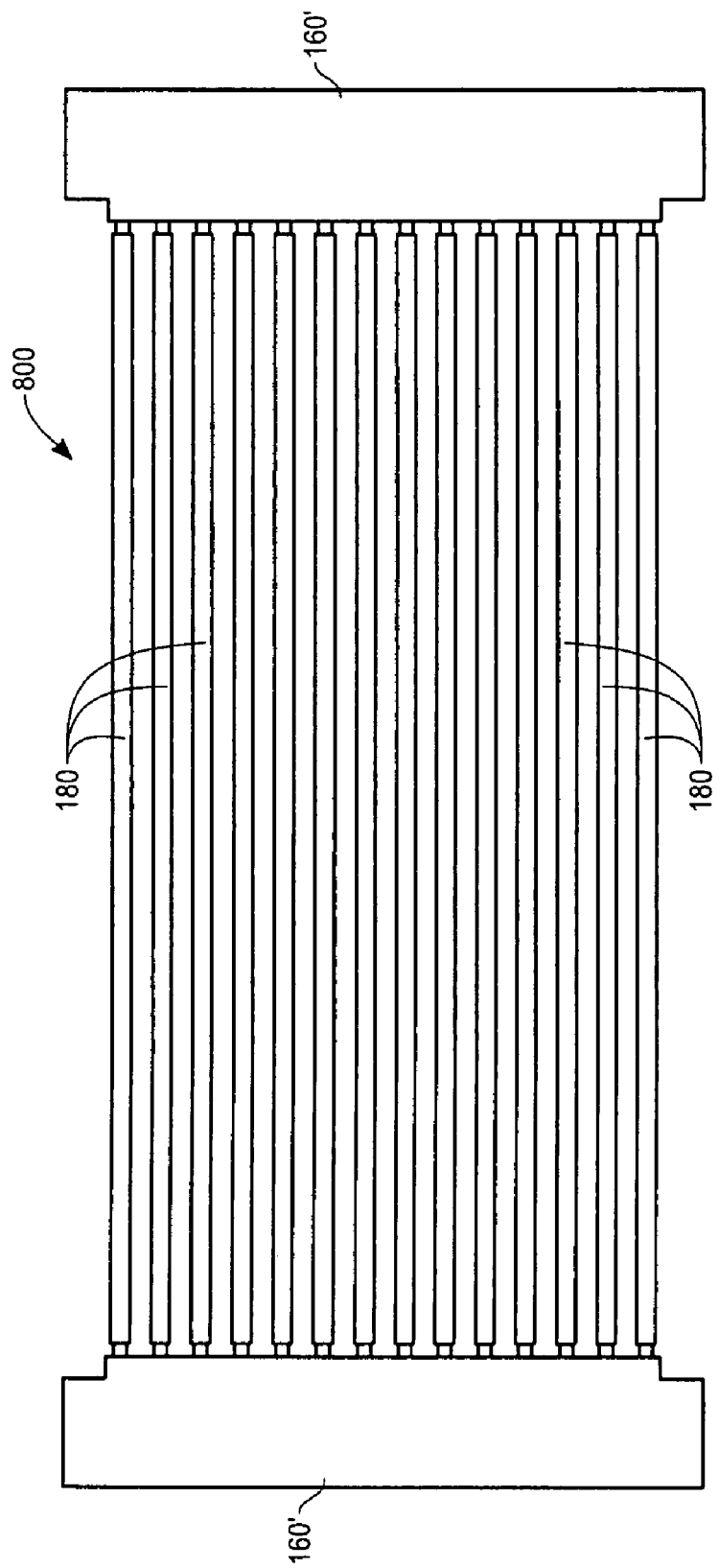
FIG. 8 is a side view of a cable assembly according to an embodiment of the invention.
Figure 9:
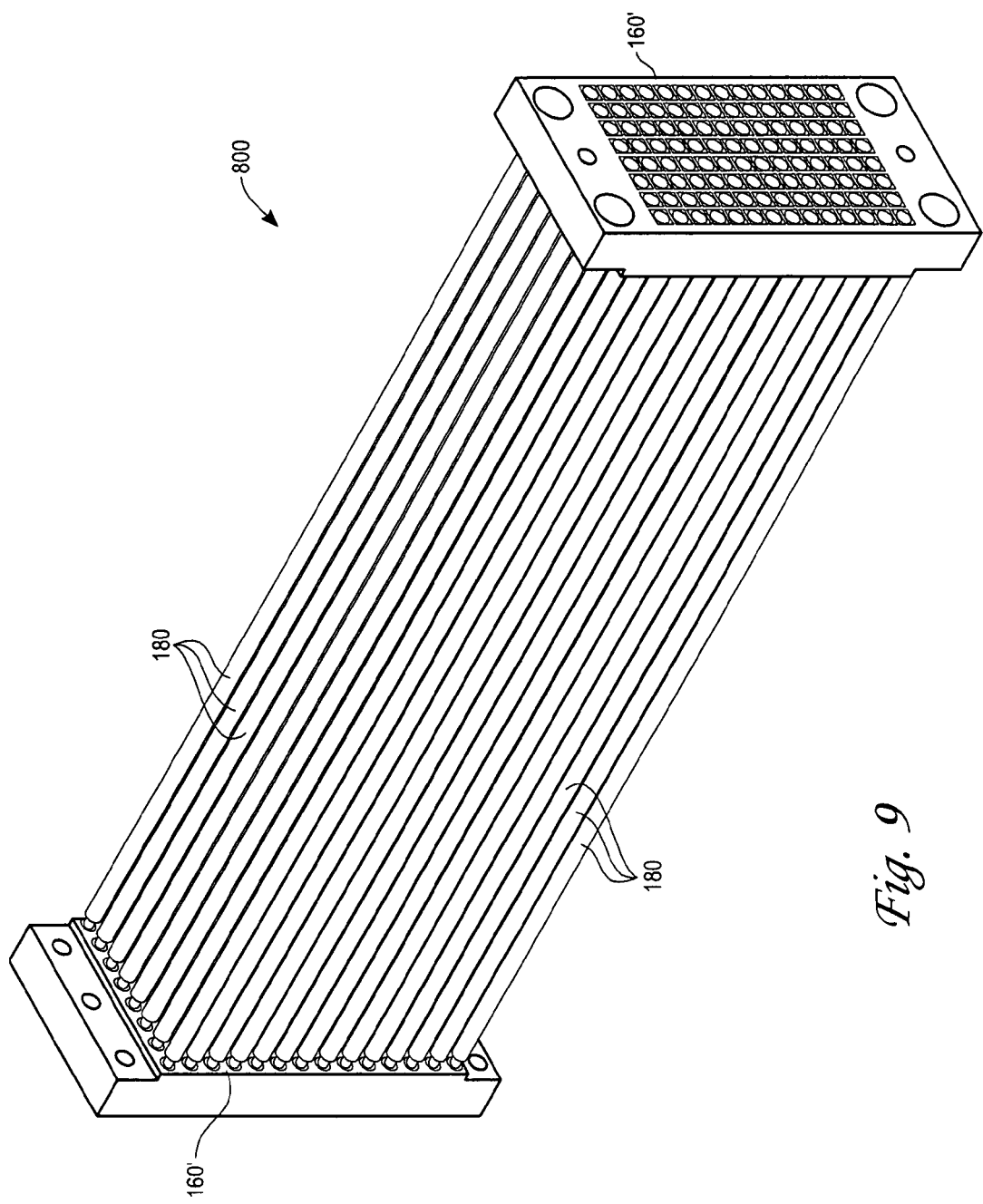
FIG. 9 is a perspective view of the cable assembly of FIG. 8 according to an embodiment of the invention.

As illustrated in FIGS. 8 and 9, which are a side view and perspective view respectively of a cable assembly according to an embodiment of the invention, cable assembly 800 may include a series of cables 180 connecting opposing assembly 160' having multiple subassemblies 700 (for example, see FIG. 7) in accordance with the teachings of the present invention. As noted above, while FIG. 8 is illustrated with a caption reading "Cable Assembly for PCB to PCB Connectivity," other structures (e.g., substrates, MLOs, MLCs, interfaces, connectors, etc.) are envisioned such as having the cables terminate in an interface to be connected to a connector of a PCB.

It is noted that cable assembly 800 of FIGS. 8 and 9 may also provide for a flexible interfacing between opposing structures (not shown) that may account for, minimize, and/or correct coplanarity/planarity issues of one or each of such structures. Such flexibility of an exemplary cable assembly 800 also may relieve or reduce stress otherwise inherent in connecting opposing structures (not shown). Embodiments of the invention also provide a better path for impedance control (e.g., bandwidth).

It is also contemplated within the teachings of the present invention that one end of coaxial cables 180 may be connected to assembly 160' such as that shown in FIG. 7 while the other respective ends of coaxial cables 180 may be connected to a different structure as dictated by the specific needs of the cable assembly 800 in question.

It is also contemplated that single or multiple such cable assemblies 800 may be utilized in specific applications such as, but not limited to, electronic device testing.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. An assembly having a first surface and a second surface, comprising:
    a first layer having a first aperture that extends there-through;
    a second layer joined to the first layer, wherein the second layer comprises:
        a second aperture having a first diameter that is smaller than a second diameter of said first aperture, and wherein said second aperture has a center that is substantially concentric to the center of said first aperture, and a signal via that extends from said second aperture to a surface of the second layer, wherein said signal via has a center that is substantially concentric to the center of said second aperture, wherein said signal via has a third diameter that is smaller than said first diameter of said second aperture; and a coaxial cable affixed to said assembly, wherein an exposed portion of a conductive core of said coaxial cable is positioned in said signal via, wherein an exposed portion of an insulating spacer sheath of said coaxial cable is positioned in said second aperture, and wherein an exposed portion of a conductive sheath of said coaxial cable is positioned in said first aperture.

2. The assembly of claim 1, wherein said first layer and said second layer have a conductive layer disposed therebetween.

3. The assembly of claim 1, wherein said first layer and said second layer have one or more shield vias extending therethrough, wherein each of the one or more shield vias are substantially equidistant from each another, and wherein each of the one or more shield vias are substantially equidistant from the first aperture.

4. The assembly of claim 1, wherein the first aperture and the signal via are coated with a conductive layer.

5. The assembly of claim 1, wherein a portion of said signal via is electrically isolated from said first aperture.

6. The assembly of claim 1, wherein said coaxial cable is affixed to said assembly using a conductive coupling mechanism.

* * * * *